United States Patent
Wang et al.

[11] Patent Number: 6,074,922
[45] Date of Patent: Jun. 13, 2000

[54] ENHANCED STRUCTURE FOR SALICIDE MOSFET

[75] Inventors: Pi-Shan Wang; Chun-Wen Weng; Jung-Hsien Hsu, all of Hsin-Chu, Taiwan

[73] Assignee: Taiwan Semiconductor Manufacturing Company, Hsin-Chu, Taiwan

[21] Appl. No.: 09/042,366

[22] Filed: Mar. 13, 1998

[51] Int. Cl.⁷ ................................................. H01L 21/336
[52] U.S. Cl. ........................................... 438/303; 438/648
[58] Field of Search .................................. 438/648, 303, 438/FOR 338; 257/377, 384, 412, 413

[56] References Cited

U.S. PATENT DOCUMENTS

| | | |
|---|---|---|
| 4,908,326 | 3/1990 | Ma et al. . |
| 5,168,072 | 12/1992 | Moslehi . |
| 5,322,809 | 6/1994 | Moslehi . |
| 5,397,909 | 3/1995 | Moslehi . |
| 5,661,052 | 8/1997 | Inoue et al. . |
| 5,747,373 | 5/1998 | Yu . |
| 5,902,125 | 3/1999 | Wu . |

OTHER PUBLICATIONS

S. Wolf, Silicon Processing for the VLSI Era, V. 2–Process Integration, pp. 144–150, 1990.

*Primary Examiner*—Charles Bowers
*Assistant Examiner*—Scott J. Hawranek
*Attorney, Agent, or Firm*—George O. Saile; Stephen B. Ackerman; Rosemary L.S. Pike

[57] ABSTRACT

A method for increasing salicide thickness and effective polysilicon width at a narrow polysilicon line while reducing resistance and reducing source/drain bridging risk in the fabrication of a silicided polysilicon gate is described. A polysilicon layer is provided overlying a gate oxide layer on a semiconductor substrate. A dielectric layer, such as silicon oxide, is deposited overlying the polysilicon layer. The silicon oxide layer, polysilicon layer, and gate oxide layer are patterned to form a polysilicon gate electrode having a silicon oxide layer on top of the gate electrode. Dielectric spacers, such as silicon nitride, are formed on the sidewalls of the gate electrode and the silicon oxide layer. In an alternative, silicon spacers may be formed between the gate and the silicon nitride spacers to increase the effective width of the polysilicon line. Source and drain regions associated with the gate electrode are formed within the semiconductor substrate. The silicon oxide layer on top of gate electrode is removed whereby the silicon nitride spacers extend above the gate electrode. A metal silicide is formed on the top surface of the gate electrode and over the source and drain regions. The dielectric spacers extending higher than the gate electrode prevent source/drain bridging during silicidation. This completes the formation of the salicided polysilicon gate electrode.

29 Claims, 9 Drawing Sheets

ENHANCED STRUCTURE FOR SALICIDE MOSFET

BACKGROUND OF THE INVENTION

(1) Field of the Invention

The invention relates to the fabrication of integrated circuit devices, and more particularly, to a method of reducing resistance and increasing effective polysilicon width for a narrow polysilicon line in the fabrication of integrated circuits.

(2) Description of the Prior Art

In the fabrication of integrated circuits, a silicide is often formed on top of a polysilicon gate and overlying the source and drain regions within a substrate. Typically, a titanium layer is deposited over the wafer. The wafer is subjected to a thermal process which causes the underlying silicon to react with the titanium layer to form titanium silicide. FIG. 16 illustrates a partially completed integrated circuit device of the prior art. A gate electrode 16 has been formed on the surface of a semiconductor substrate 10. Source and drain regions 20 have been formed within the substrate. Sidewall spacers 18 are typically composed of silicon dioxide or silicon nitride. A layer of titanium 24 is deposited over the surface of the wafer. A rapid thermal process causes the silicon atoms within the polysilicon gate and the substrate to diffuse into the titanium layer and react with the titanium to form titanium silicide 26, as illustrated in FIG. 17. The titanium layer 24 over the sidewall spacers 18 and the field oxide regions 12 is not reacted and can be removed easily. However, silicon from the gate and from the substrate can diffuse into the titanium layer overlying the sidewall spacers causing titanium silicide 28 to form overlying the spacers as well. This is the so-called bridging problem. The titanium silicide layer 28 over the spacers shorts the source/drain to the gate leading to malfunction of the device.

The salicide process is used to lower resistance and therefore improve device performance and reduce chip size. However, resistance is increased dramatically for narrow polysilicon lines, such as less than 0.25 $\mu$m. This is caused by polysilicon critical dimension variation and non-uniform salicide thickness.

U.S. Pat. No. 5,648,287 to Tsai et al teaches two sets of silicon oxide spacers on the sidewalls of a gate, and a nitrogen-implanted amorphous silicon layer overlying the gate and source/drain regions. The nitrogen-rich layer acts as an oxidation barrier. U.S. Pat. No. 4,912,061 to Nasr shows a salicidation process using disposable silicon nitride spacers. U.S. Pat. No. 5,091,807 to Sanchez uses polysilicon and oxide spacers before salicidation. U.S. Pat. No. 5,658,807 to Manning teaches a method of salicidation of the sidewalls of a polysilicon gate. U.S. Pat. No. 4,716,131 to Okazawa et al teaches salicidation of the polysilicon sidewalls and source and drain regions first followed by a second salicidation of the top of the polysilicon gate.

SUMMARY OF THE INVENTION

A principal object of the present invention is to provide an effective and very manufacturable method of fabricating a silicided polysilicon gate in the fabrication of an integrated circuit device.

Another object of the present invention is to provide an effective and very manufacturable method of fabricating a silicided polysilicon gate with reduced resistance in the fabrication of an integrated circuit device.

A further object of the invention is to provide a method of preventing gate to source/drain bridging in the fabrication of a silicided polysilicon gate.

A still further object is to provide a method of reducing resistance of a narrow polysilicon line in the fabrication of a silicided polysilicon gate.

Yet another object is to provide a method of increasing effective polysilicon width at a narrow polysilicon line in the fabrication of a silicided polysilicon gate.

Yet another object is to provide a method of increasing salicide thickness at a narrow polysilicon line in the fabrication of a silicided polysilicon gate.

Yet another object is to provide a method of increasing salicide thickness and effective polysilicon width at a narrow polysilicon line while reducing resistance and reducing source/drain bridging risk in the fabrication of a silicided polysilicon gate.

In accordance with the objects of this invention a method for increasing salicide thickness and effective polysilicon width at a narrow polysilicon line while reducing resistance and reducing source/drain bridging risk in the fabrication of a silicided polysilicon gate is achieved. A polysilicon layer is provided overlying a gate oxide layer on a semiconductor substrate. A dielectric layer, such as silicon oxide, is deposited overlying the polysilicon layer. The silicon oxide layer, polysilicon layer, and gate oxide layer are patterned to form a polysilicon gate electrode having a silicon oxide layer on top of the gate electrode. Dielectric spacers, such as silicon nitride, are formed on the sidewalls of the gate electrode and the silicon oxide layer. In an alternative, silicon spacers may be formed between the gate and the silicon nitride spacers to increase the effective width of the polysilicon line. Source and drain regions associated with the gate electrode are formed within the semiconductor substrate. The silicon oxide layer on top of gate electrode is removed whereby the silicon nitride spacers extend above the gate electrode. A metal silicide is formed on the top surface of the gate electrode and over the source and drain regions. The dielectric spacers extending higher than the gate electrode prevent source/drain bridging during silicidation. This completes the formation of the salicided polysilicon gate electrode.

Also in accordance with the objects of the present invention, an improved silicided polysilicon gate in an integrated circuit device is achieved. A gate dielectric layer is formed on a semiconductor substrate. A gate is formed on the gate dielectric layer. First spacers made of silicon are formed at both sides of the gate dielectric layer and the gate electrode. Second spacers made of a dielectric material are formed at the outer sides of the first spacers and extending above the gate. A metal silicide layer is formed on top of the gate and between the second spacers. Implanted source and drain regions are formed in the semiconductor substrate at the outer sides of the second spacers. Metal silicide areas are formed on the source and drain regions.

BRIEF DESCRIPTION OF THE DRAWINGS

In the accompanying drawings forming a material part of this description, there is shown.

DESCRIPTION OF THE PREFERRED EMBODIMENTS

The process of the present invention provides a method for forming a salicided polysilicon gate where resistance is not degraded, especially in the case of narrow polysilicon lines, as narrow as 0.24 microns. The process of the invention also results in reduced gate to source/drain bridging risk and improved yield. Two preferred embodiments of the present invention will be described, the first with reference to drawing FIGS. 1 through 9, and the second with reference to FIGS. 10 through 15.

Figure 1:
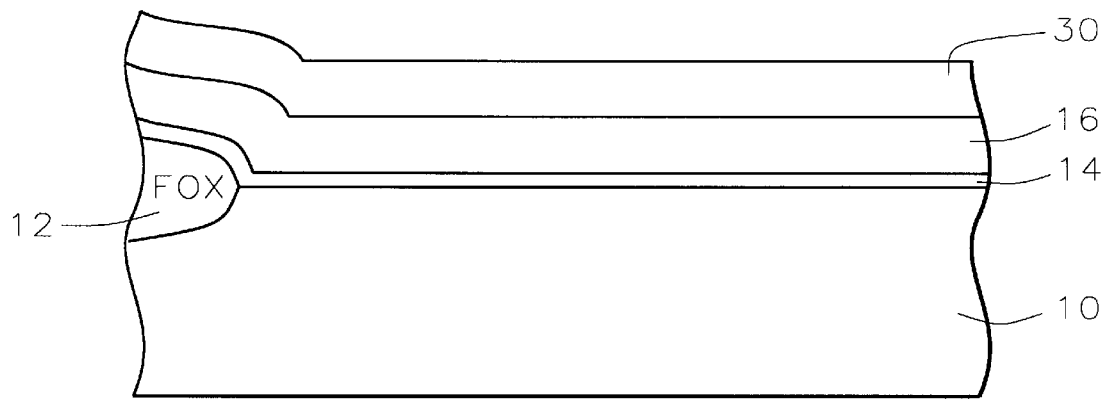
FIGS. 1 through 9 schematically illustrate in cross-sectional representation a first preferred embodiment of the present invention.

The first embodiment of the present invention will be described with reference to FIGS. 1–9. Referring now more particularly to FIG. 1, there is shown an illustration of a portion of a partially completed integrated circuit. The semiconductor substrate 10 is preferably composed of silicon having a (100) crystallographic orientation. Isolation between active and inactive regions, such as Field Oxide regions 12, are formed as are conventional in the art. The surface of the silicon substrate 10 is thermally oxidized to form the gate oxide layer 14.

Next, a layer of polysilicon 16 is deposited, for example, by low pressure chemical vapor deposition (LPCVD), to a suitable thickness of between about 2000 and 3000 Angstroms.

A layer of dielectric material 30 is deposited overlying the polysilicon layer 16. This dielectric material is used to reserve a space for salicidation, so may be any dielectric material which may be removed smoothly. For example, silicon oxide may be used. The silicon oxide layer 30, for example, is deposited to a thickness of between about 1500 and 2000 Angstroms.

Figure 2:
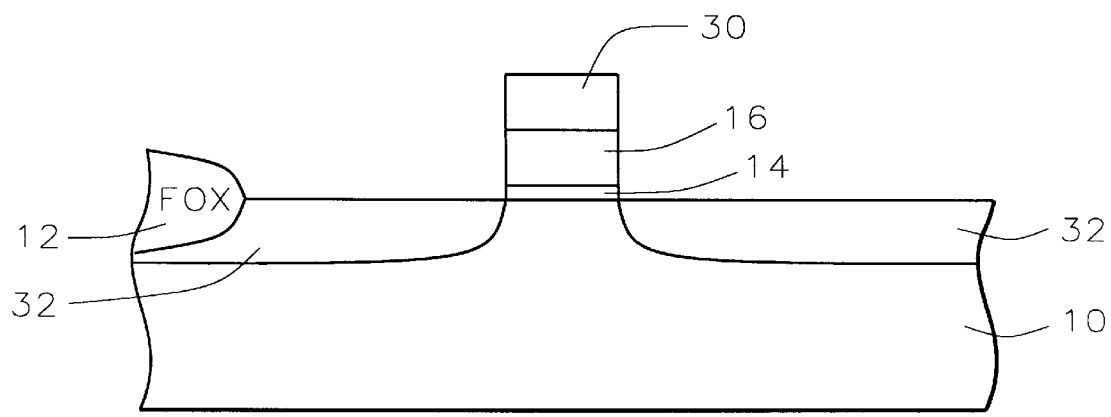

Referring now to FIG. 2, the silicon oxide, polysilicon and gate oxide layers are etched away where they are not covered by a mask to provide a polysilicon gate electrode. After etching, the remaining oxide thickness over the polysilicon line is about 400 to 600 Angstroms.

Lightly doped source and drain regions 32 are formed by ion implantation, as is conventional in the art.

Figure 3:
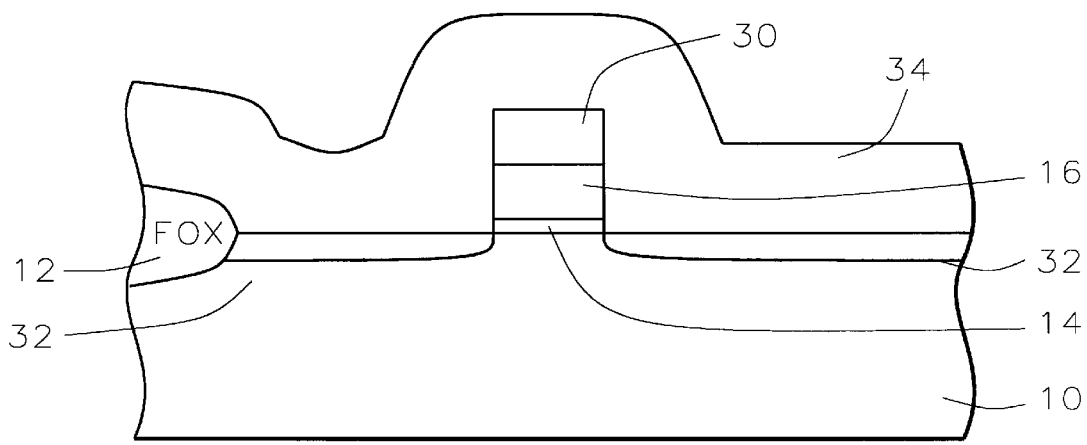

Referring now to FIG. 3, a second dielectric layer 34 is deposited over the gate electrode and the surface of the substrate to a thickness of between about 1500 and 2000 Angstroms. This layer preferably may be silicon nitride, or some other material such as plasma-enhanced oxide (PEOX) or tetraethoxysilane (TEOS) oxide.

Figure 4:
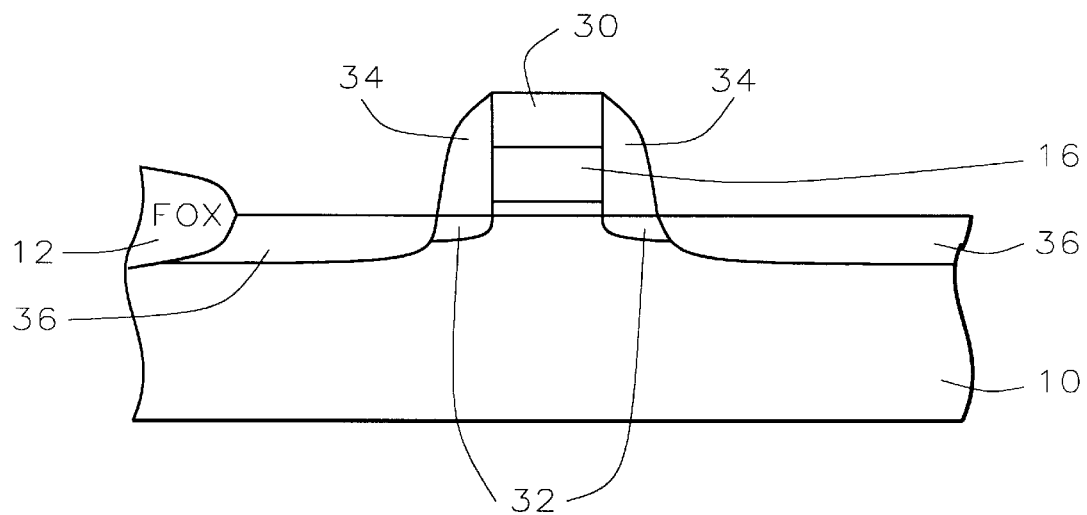

The silicon nitride layer is anisotropically etched to leave spacers 34 on the sidewalls of the gate electrode, as shown in FIG. 4. The spacers may be between about 1000 and 1500 Angstroms wide, as is conventional in the art. However, the spacers are higher than is conventional in the art because of the presence of the silicon oxide layer 30 overlying the polysilicon gate electrode.

Heavily doped source and drain regions 36 are formed within the semiconductor substrate.

Figure 5:
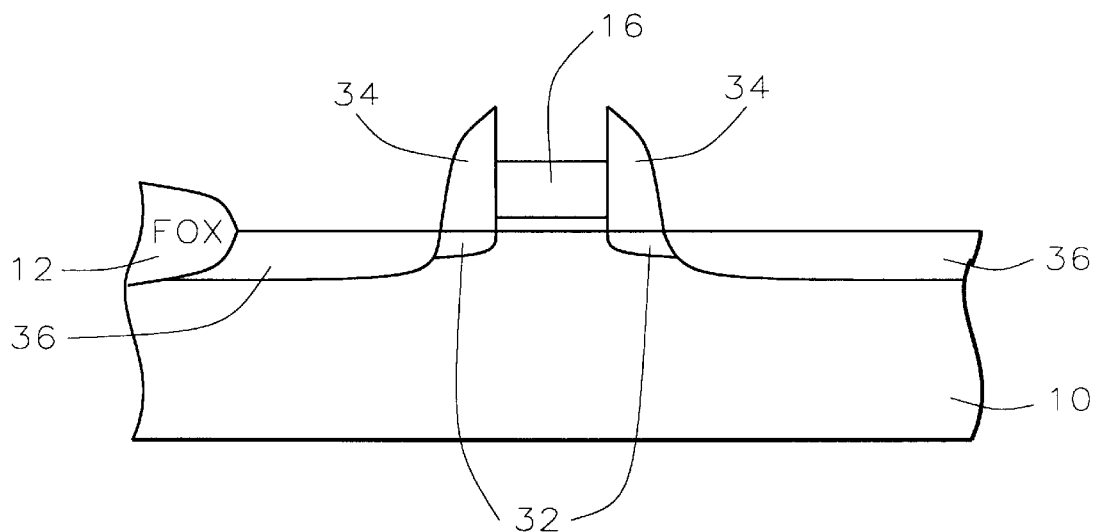
Figure 6:
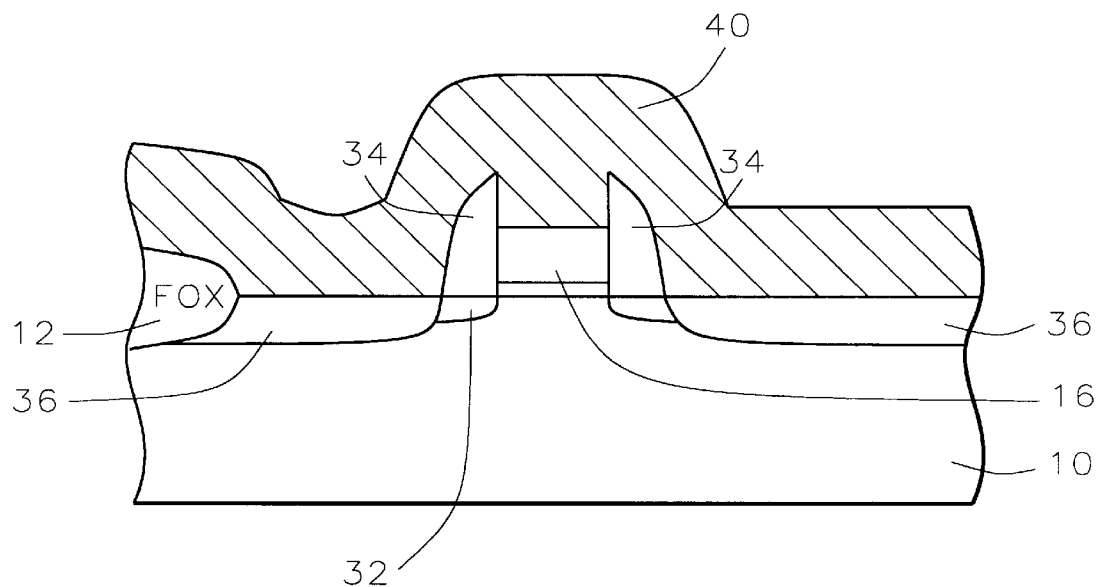

Referring now to FIG. 5, a wet dip is used to remove the silicon oxide layer 30 overlying the polysilicon gate 16. This leaves the tall silicon nitride spacers on the sidewalls of the polysilicon gate and extending above the top of the polysilicon gate.

Now the salicided polysilicon gate of the present invention will be formed. A layer of titanium or other metals such as nickel, cobalt, of the like, 40 is blanket deposited over the semiconductor substrate, as shorn in FIG. 6, to a thickness of between about 200 and 400 Angstroms.

Figure 7:
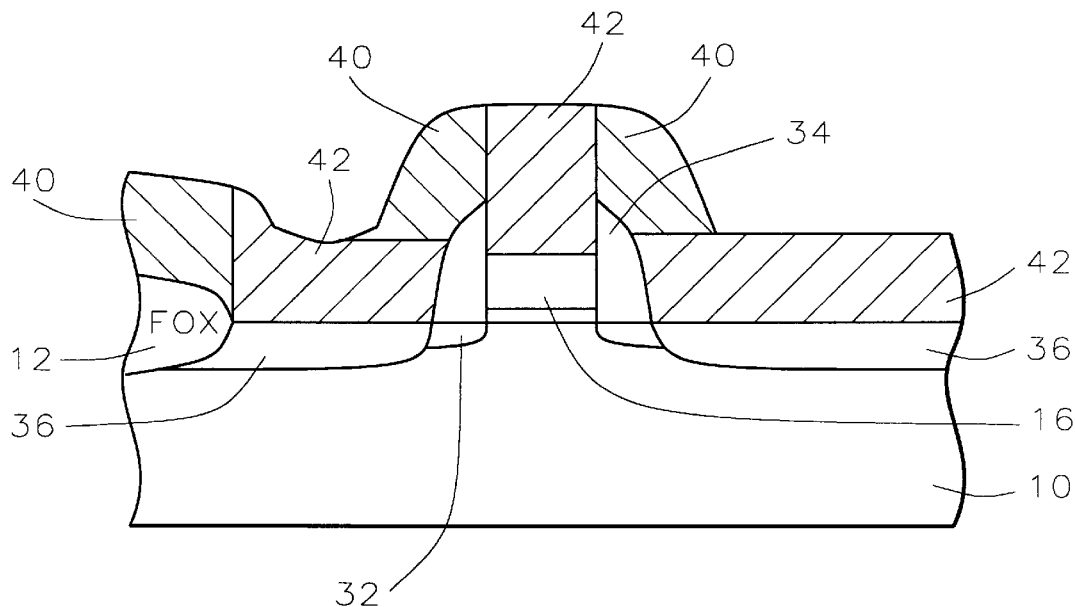
Figure 8:
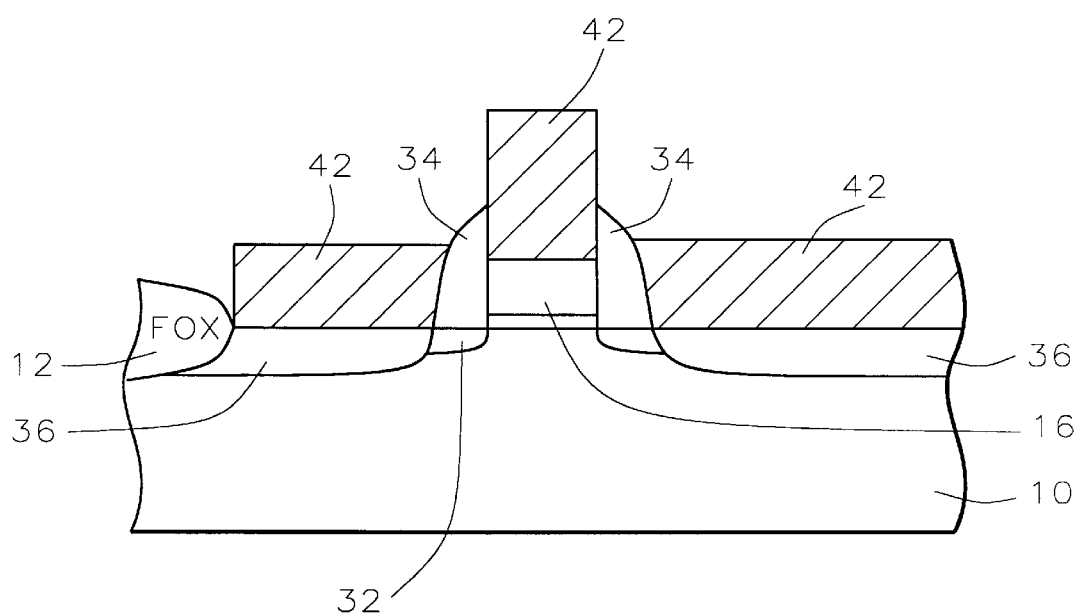

Referring now to FIG. 7, the titanium layer 40 is transformed into titanium silicide 42 by a thermal annealing cycle. This is preferably a rapid thermal anneal (RTA) at a temperature of between about 700 to 740° C. for between about 20 to 30 seconds in a nitrogen ambient. The titanium in contact with the silicon substrate or with the polysilicon will form titanium silicide, $TiSi_x$ 42. The tall spacers 34 provide better anti-bridging protection than conventional spacers since they extend above the surface of the gate electrode. The remaining unreacted titanium 40 can be etched away using, for example, $NH_4OH/H_2O_2$ with deionized water. The resulting structure is illustrated in FIG. 8.

The process of the present invention enlarges the salicide window. Since the salicide layer 42 over the polysilicon gate electrode is thicker than conventional (because of the taller silicon nitride spacers), the salicide is more uniform than in the prior art. This solves the resistance degradation problem for narrow polysilicon lines caused by salicide non-uniformity. The bridging problem also is solved by the taller spacers.

Figure 9:
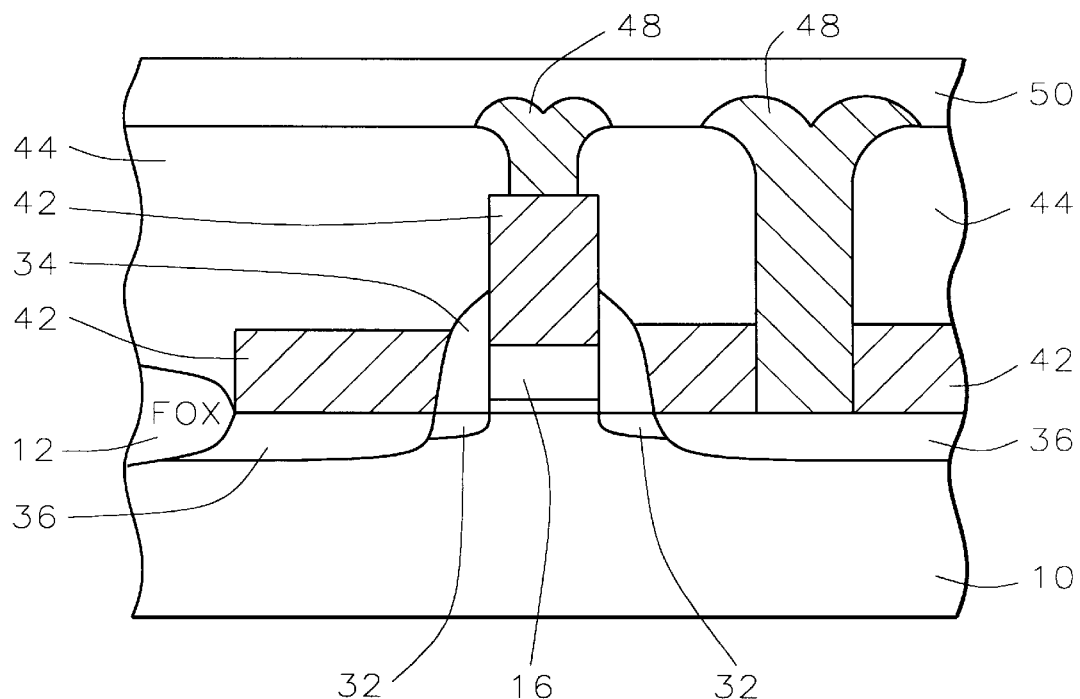

The integrated circuit device is completed as is conventional in the art. For example, as illustrated in FIG. 9, an insulating layer, such as silicon oxide or borophospho-TEOS (BPTEOS) 44 is blanket deposited over the semiconductor substrate to a thickness of between about 4000 to 12,000 Angstroms and then planarized, for example, by chemical mechanical polishing (CMP). Openings are etched through the insulating layer and the titanium silicide layer to underlying source and drain regions and other areas where electrical contact is to be made. A conducting layer 48 is deposited and patterned to complete the electrical connections. A passivation layer 50 completes the fabrication of the integrated circuit device.

Figure 10:
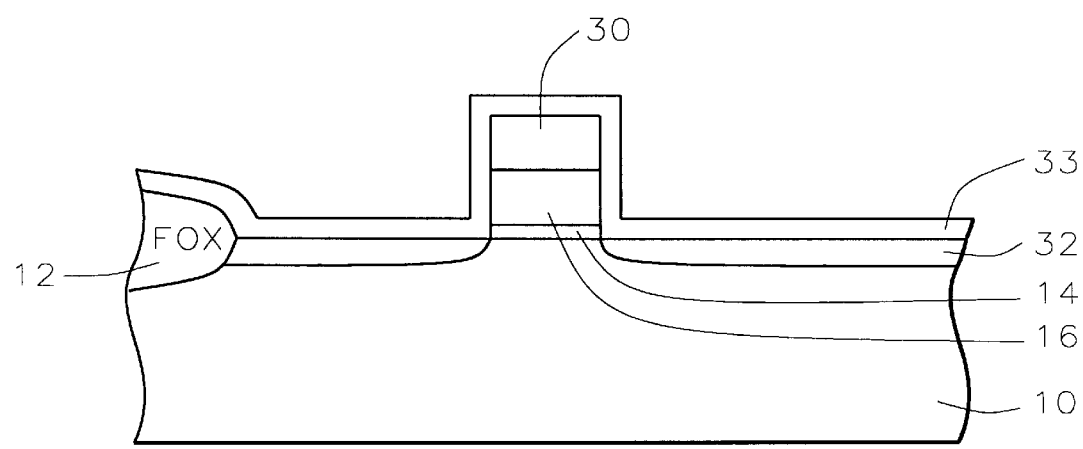
FIGS. 10 through 15 schematically illustrate in cross-sectional representation a second preferred embodiment of the present invention.

The second embodiment of the present invention now will be described with reference to FIGS. 10–15. As in the first embodiment, the polysilicon and overlying silicon oxide layers are deposited and patterned to form the gate electrode illustrated in FIG. 2 and lightly doped source and drain regions 32 are formed within the substrate. Referring now to FIG. 10, a layer of amorphous silicon or polysilicon 33 is deposited conformally over the gate electrode and the surface of the substrate to a thickness of between about 100 and 300 Angstroms.

Figure 11:
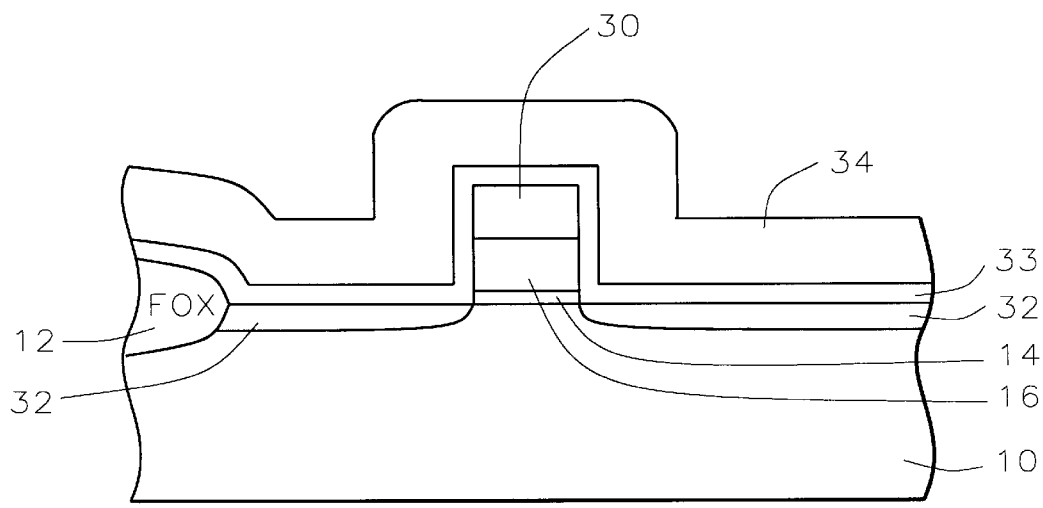

Then, the silicon nitride layer 34 is deposited over the gate electrode and the surface of the substrate, as illustrated in FIG. 11.

Figure 12:
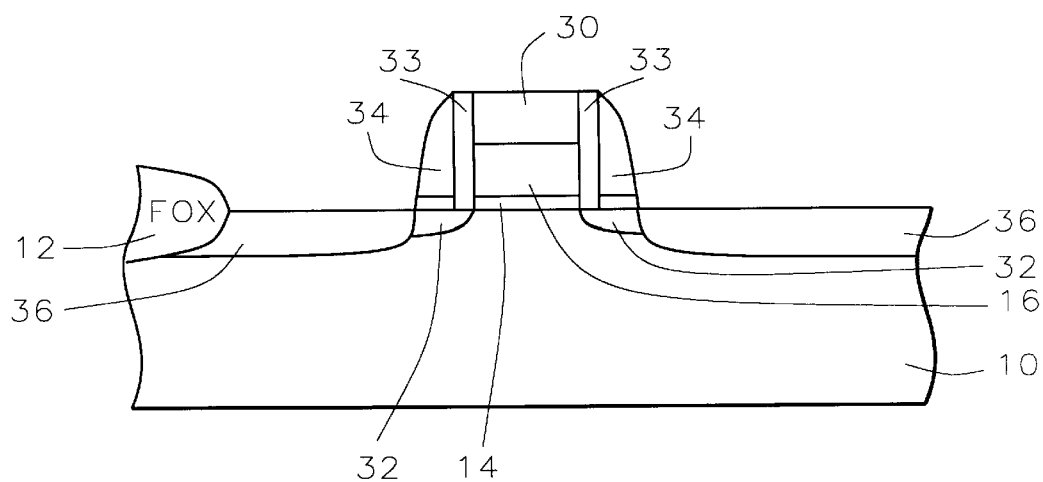

Referring now to FIG. 12, the silicon nitride layer is anisotropically etched to leave spacers 34 on the sidewalls of the gate electrode. An overetch removes the amorphous silicon or polysilicon layer 33 on top of the oxide 30 and overlying the substrate. As in the first embodiment, the presence of the silicon oxide layer 30 overlying the polysilicon gate electrode results in tall spacers 34.

Heavily doped source and drain regions 36 are formed within the semiconductor substrate, as is conventional in the art.

Figure 13:
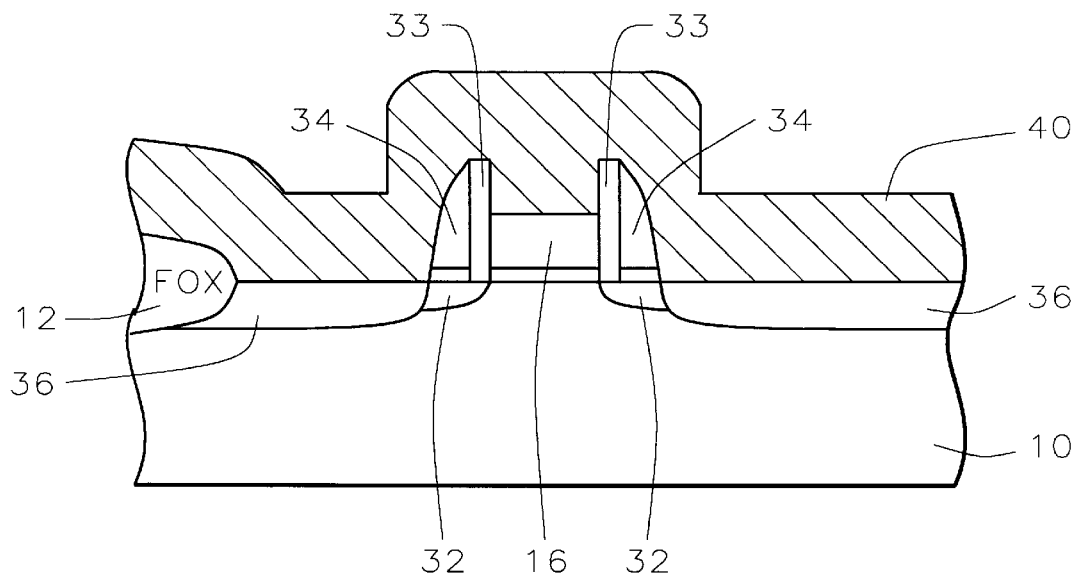

Referring now to FIG. 13, a wet dip is used to remove the silicon oxide layer 30 overlying the polysilicon gate 16. This leaves the amorphous silicon or polysilicon spacers and the tall silicon nitride spacers on the sidewalls of the polysilicon gate and extending above the top of the polysilicon gate.

Now the silicided polysilicon gate of the present invention will be formed. As in the first embodiment, a layer of titanium or other metal such as nickel, cobalt, or the like, 40 is blanket deposited over the semiconductor substrate, as shown in FIG. 13, to a thickness of between about 200 and 400 Angstroms.

Figure 14:
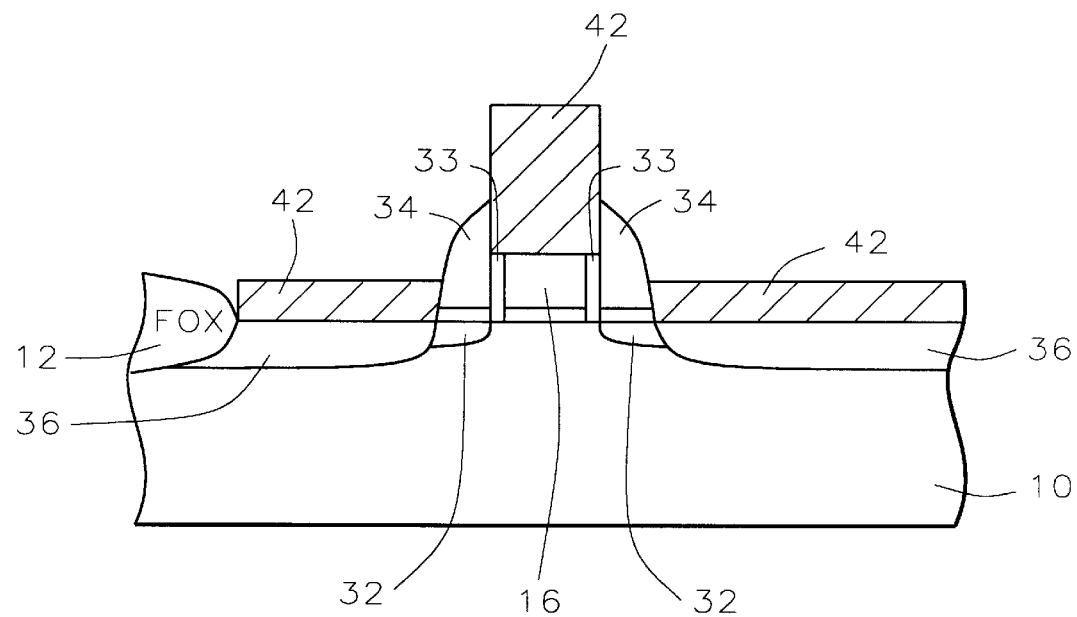

The titanium layer 40 is transformed into titanium silicide 42 by a thermal annealing cycle. This is preferably a rapid thermal anneal (RTA) at a temperature of between about 700 to 740° C. for between about 20 to 30 seconds in a nitrogen ambient. The titanium in contact with the silicon substrate or with the polysilicon will form titanium silicide, $TiSi_x$ 42. The silicon spacers 33 provide additional silicon for better silicidation which results in lower resistance. The silicon spacers 33 on the sidewalls of the polysilicon 16 also provide extra width for the salicide layer. The tall spacers 34 provide better anti-bridging protection than conventional spacers because they extend above the surface of the gate electrode. The remaining unreacted titanium 40 can be etched away using, for example, $NH_4OH/H_2O_2$ with deionized water. The resulting structure is illustrated in FIG. 14.

The process of the present invention increases the effective polysilicon width at the narrow polysilicon line by the presence of the silicon spacers 33. The salicide layer 42 over the polysilicon gate electrode is thicker than conventional (because of the taller silicon nitride spacers); therefore, the salicide is more uniform than in the prior art. This reduces the resistance increase for narrow polysilicon lines which in turn improves yield. The tall silicon nitride spacers also reduce the gate to source/drain bridging risk.

Figure 15:
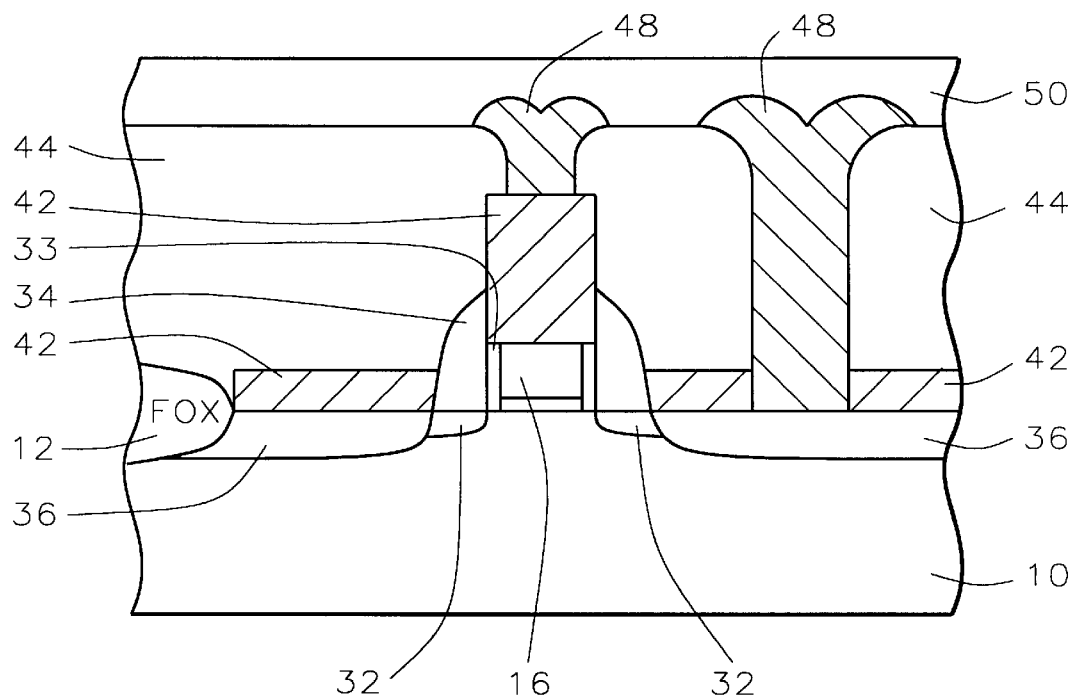
Figure 16:
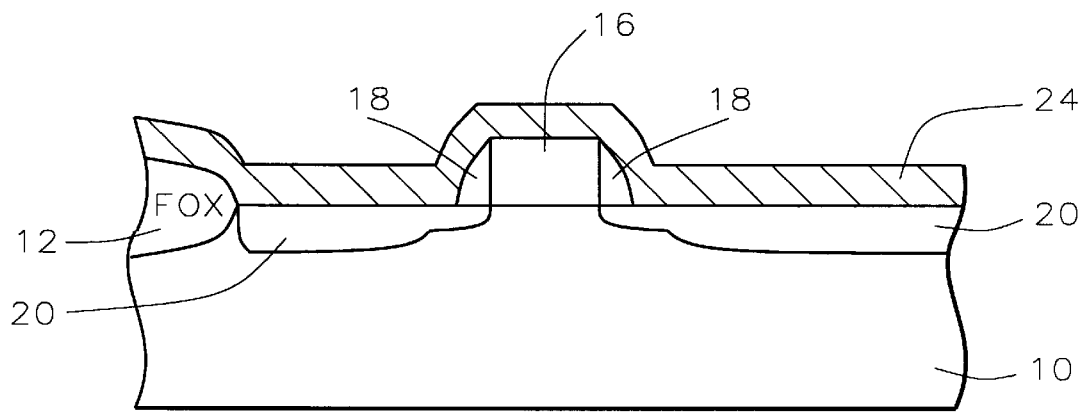
FIGS. 16 and 17 schematically illustrate in cross-sectional representation an embodiment of the prior art.
Figure 17:
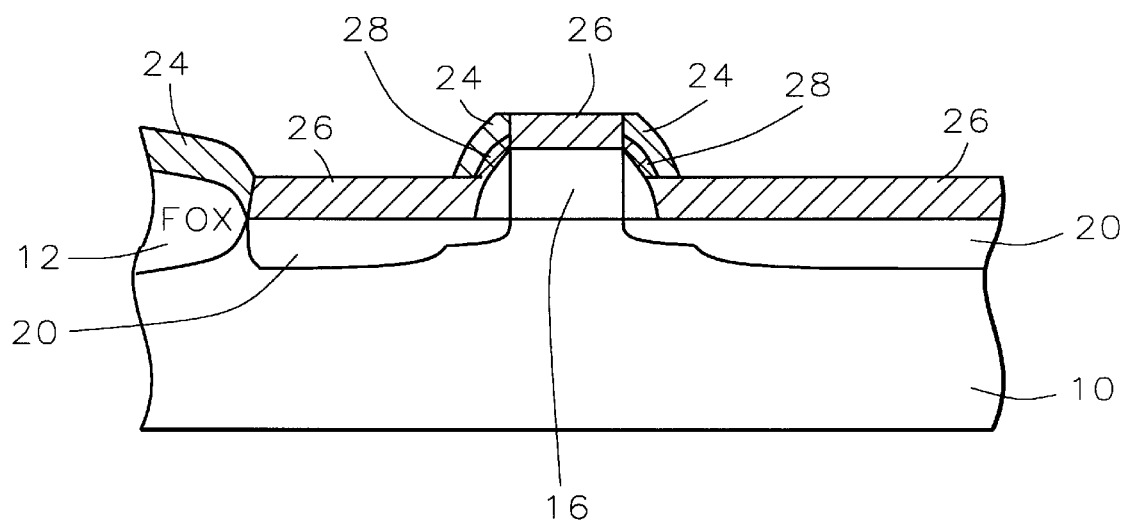

As in the first embodiment, the integrated circuit device is completed as is conventional in the art. For example, as illustrated in FIG. 15, an insulating layer, such as silicon oxide or borophospho-TEOS (BPTEOS) 44 is blanket deposited over the semiconductor substrate to a thickness of between about 4000 to 12,000 Angstroms and then planarized, for example, by chemical mechanical polishing (CMP). Openings are etched through the insulating layer and the titanium silicide layer to underlying source and drain regions and other areas where electrical contact is to be made. A conducting layer 48 is deposited and patterned to complete the electrical connections. A passivation layer 50 completes the fabrication of the integrated circuit device.

The process of the invention provides an effective method of fabricating an integrated circuit device having a silicided polysilicon gate with reduced resistance, increased effective polysilicon width, increased salicide thickness, improved yield, and reduced gate to source/drain bridging.

The improved silicided polysilicon gate in an integrated circuit device of the present invention will be described with reference to FIGS. 9 and 15. A gate dielectric layer 14 is formed on a semiconductor substrate. A gate 16 is formed on the gate dielectric layer. Optional first spacers 33, shown in FIG. 15, are formed at both sides of the gate dielectric layer and the gate electrode. These spacers may be amorphous silicon or polysilicon. Second spacers 34 made of a dielectric material, such as silicon nitride, are formed on the sidewalls of the gate (as in FIG. 9) or at the outer sides of the first spacers 33 (as in FIG. 15) and extending above the gate 16. A metal silicide layer 42 is formed on top of the gate and between the second spacers 34. Implanted source and drain regions 36 are formed in the semiconductor substrate at the outer sides of the second spacers. Metal silicide areas 42 are formed on the source and drain regions.

The improved silicided polysilicon gate of the present invention has reduced resistance, increased effective polysilicon width (where silicon spacers are used as in FIG. 15), increased salicide thickness, improved yield, and reduced gate to source/drain bridging.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

providing a gate conductive layer overlying a gate dielectric layer on a semiconductor substrate;

depositing a first dielectric layer overlying said gate conductive layer;

patterning said first dielectric layer, said gate conductive layer, and said gate dielectric layer to form a gate electrode having a first dielectric layer on top of said gate electrode;

forming first silicon spacers on the sidewalls of said gate electrode and said first dielectric layer and forming second spacers comprising a second dielectric layer on the sidewalls of said first spacers;

forming source and drain regions associated with said gate electrode within said semiconductor substrate;

removing said first dielectric layer on top of said gate electrode whereby said spacers extend above said gate electrode; and forming a metal silicide on said gate electrode and said source and drain regions within said semiconductor substrate wherein said first silicon spacers provide additional silicon for said forming of said metal silicide to complete the fabrication of said integrated circuit device.

2. The method according to claim 1 wherein said first dielectric layer comprises silicon oxide having a thickness of between about 1500 and 2000 Angstroms.

3. The method according to claim 1 wherein said second spacers comprise silicon nitride and have a width of between about 1000 and 1500 Angstroms.

4. The method according to claim 1 wherein said first silicon spacers comprise polysilicon and have a width of between about 100 and 300 Angstroms.

5. The method according to claim 1 wherein said first silicon spacers comprise amorphous silicon and have a width of between about 100 and 300 Angstroms.

6. The method according to claim 1 wherein said step of forming said metal silicide comprises:

depositing a metal layer over said gate electrode, said spacers, and said source and drain regions within said semiconductor substrate;

annealing said semiconductor substrate whereby said metal layer is transformed into a metal silicide layer except where said metal layer overlies said spacers; and stripping said metal layer overlying said spacers to leave said metal silicide layer only on the top surface of said gate electrode and on the top surface of said semiconductor substrate overlying said source and drain regions.

7. The method according to claim 6 wherein said annealing is a rapid thermal anneal (RTA) performed in a nitrogen ambient at a temperature of between about 700 and 740° C. for between about 20 to 30 seconds.

8. The method according to claim 6 wherein said stripping of said titanium layer overlying said spacers is done using $NH_4OH/H_2O_2/H_2O$.

9. The method according to claim 1 wherein said metal comprises one of the group containing titanium, cobalt, and nickel.

10. The method according to claim 6 wherein said metal layer is deposited to a thickness of between about 200 and 400 Angstroms.

11. A method of fabricating an integrated circuit device comprising:

providing a gate conductive layer overlying a gate dielectric layer on a semiconductor substrate;

depositing a first dielectric layer overlying said gate conductive layer;

patterning said first dielectric layer, said gate conductive layer, and said gate dielectric layer to form a gate electrode having a first dielectric layer on top of said gate electrode;

forming first silicon spacers on the sidewalls of said polysilicon gate electrode and said silicon oxide layer and forming second spacers comprising a second dielectric layer on the sidewalls of said first spacers;

forming source and drain regions associated with said gate electrode within said semiconductor substrate;

removing said first dielectric layer on top of said gate electrode whereby said first and second spacers extend above said gate electrode; and forming a metal silicide on said gate electrode and said source and drain regions within said semiconductor substrate to complete the fabrication of said integrated circuit device.

12. The method according to claim 11 wherein said first dielectric layer comprises silicon oxide having a thickness of between about 1500 and 2000 Angstroms.

13. The method according to claim 11 wherein said first spacers comprise amorphous silicon and have a width of between about 100 and 300 Angstroms.

14. The method according to claim 11 wherein said first spacers comprise polysilicon and have a width of between about 100 and 300 Angstroms.

15. The method according to claim 11 wherein said second spacers comprise silicon nitride and have a width of between about 1000 and 1500 Angstroms.

16. The method according to claim 11 wherein said step of forming said metal silicide comprises:

depositing a metal layer over said gate electrode, said spacers, and said source and drain regions within said semiconductor substrate;

annealing said semiconductor substrate whereby said metal layer is transformed into a metal silicide layer except where said metal layer overlies said spacers; and stripping said metal layer overlying said spacers to leave said metal silicide layer only on the top surface of said gate electrode and on the top surface of said semiconductor substrate overlying said source and drain regions.

17. The method according to claim 16 wherein said metal layer is deposited to a thickness of between about 200 and 400 Angstroms.

18. The method according to claim 16 wherein said annealing is a rapid thermal anneal (RTA) performed in a nitrogen ambient at a temperature of between about 700 and 740° C. for between about 20 to 30 seconds.

19. The method according to claim 16 wherein said stripping of said titanium layer overlying said spacers is done using $NH_4OH/H_2O_2/H_2O$.

20. The method according to claim 11 wherein said metal comprises one of the group containing titanium, cobalt, and nickel.

21. A method of fabricating an integrated circuit device comprising:

providing a polysilicon layer overlying a gate dielectric layer on a semiconductor substrate;

depositing a first dielectric layer overlying said polysilicon layer;

patterning said first dielectric layer, said polysilicon layer, and said gate dielectric layer to form a gate electrode having a first dielectric layer on top of said gate electrode;

forming first silicon spacers on the sidewalls of said gate electrode and said first dielectric layer and forming second silicon nitride spacers on the sidewalls of said first spacers;

forming source and drain regions associated with said gate electrode within said semiconductor substrate;

removing said first dielectric layer on top of said gate electrode whereby said first and second spacers extend above said gate electrode; and forming a metal silicide on said gate electrode and said source and drain regions within said semiconductor substrate wherein said first silicon spacers provide additional silicon for said forming of said metal silicide to complete the fabrication of said integrated circuit device.

22. The method according to claim 21 wherein said first dielectric layer comprises silicon oxide having a thickness of between about 1500 and 2000 Angstroms.

23. The method to claim 21 wherein said first silicon spacers comprise amorphous silicon and have a width of between 100 and 300 Angstroms.

24. The method according to claim 21 wherein said first silicon spacers comprise polysilicon and have a width of between about 100 and 300 Angstroms.

25. The method according to claim 22 wherein said step of forming said metal silicide comprises:

depositing a metal layer over said gate electrode, said spacers, and said source and drain regions within said semiconductor substrate;

annealing said semiconductor substrate whereby said metal layer is transformed into a metal silicide layer except where said metal layer overlies said silicon nitride spacers; and stripping said metal layer overlaying said spacers to leave said metal silicide layer only on the top surface of said gate electrode and on the top surface of said semiconductor substrate overlying said source and drain regions.

26. The method according to claim 21 wherein said metal comprises one of the group containing titanium, cobalt, and nickel.

27. The method according to claim 21 wherein said metal layer is deposited to a thickness of between about 200 and 400 Angstroms.

28. The method according to claim 21 wherein said annealing is a rapid thermal anneal (RTA) performed in a nitrogen ambient at a temperature of between about 700 and 740° C. for between about 20 to 30 seconds.

29. The method according to claim 21 wherein said stripping of said titanium layer overlying said spacers is done using $NH_4OH/H_2O_2/H_2O$.

* * * * *